(12) United States Patent
Shoki

(10) Patent No.: US 7,910,264 B2
(45) Date of Patent: Mar. 22, 2011

(54) REFLECTIVE MASK BLANK FOR EXPOSURE, REFLECTIVE MASK FOR EXPOSURE, METHOD OF PRODUCING A SEMICONDUCTOR DEVICE, AND SUBSTRATE PROVIDED WITH MULTILAYER REFLECTIVE FILM

(75) Inventor: Tsutomu Shoki, Tokyo (JP)

(73) Assignee: Hoya Corporation, Tokyo (JP)

(*) Notice: Subject to any disclaimer, the term of this patent is extended or adjusted under 35 U.S.C. 154(b) by 200 days.

(21) Appl. No.: 11/874,446

(22) Filed: Apr. 15, 2008

(65) Prior Publication Data

US 2009/0017387 A1    Jan. 15, 2009

(30) Foreign Application Priority Data

Oct. 18, 2006   (JP) .................. 2006-283754

(51) Int. Cl.
*G03F 1/00*    (2006.01)

(52) U.S. Cl. .......................................... 430/5

(58) Field of Classification Search .............. 430/5, 394; 378/35
See application file for complete search history.

(56) References Cited

U.S. PATENT DOCUMENTS 6,756,285 B1 *  6/2004  Moriceau et al. ............. 438/455
6,951,502 B2 * 10/2005  Koike et al. ........................ 451/8

FOREIGN PATENT DOCUMENTS

JP   727198 B2   3/1995
JP   8213303 A   8/1996

* cited by examiner

*Primary Examiner* — Stephen Rosasco
(74) *Attorney, Agent, or Firm* — Sughrue Mion, PLLC

(57) ABSTRACT

To provide a reflective mask blank for exposure that can solve a problem of adsorption failure in fixing a reflective mask using an electrostatic chuck and thus can flatten the surface of the mask using the electrostatic chuck, thereby realizing high-accuracy pattern transfer. In a reflective mask blank for exposure having a multilayer reflective film formed on a board and adapted to reflect exposure light and an absorbent layer formed on the multilayer reflective film and adapted to absorb the exposure light, the shape of a surface of the mask blank on its side opposite to its transfer pattern forming surface is a shape having a convex surface.

14 Claims, 7 Drawing Sheets

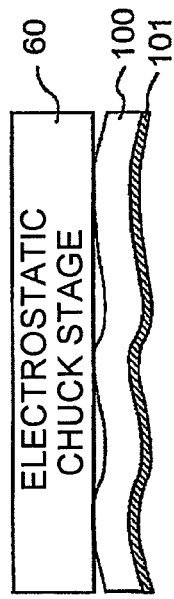
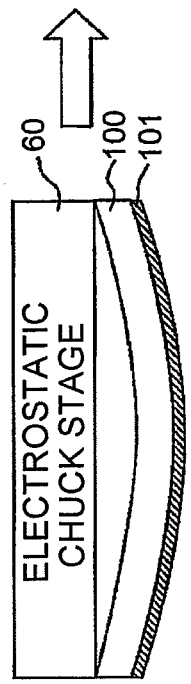
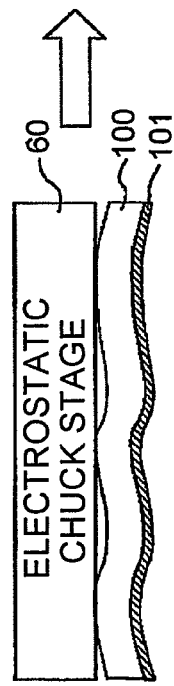
FIG. 3A
PRIOR ART
FIG. 3B
PRIOR ART

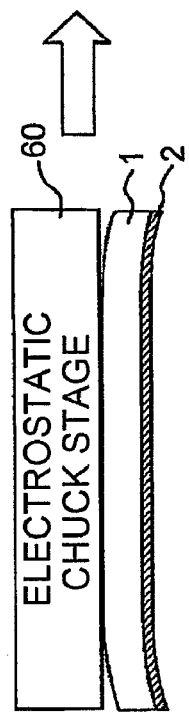
FIG. 5A
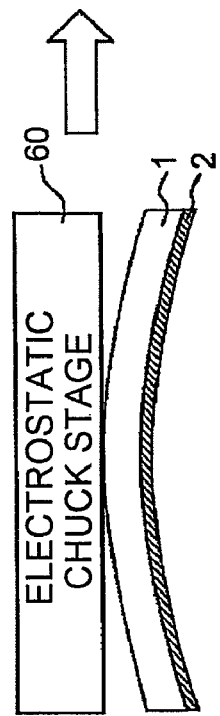
FIG. 5B
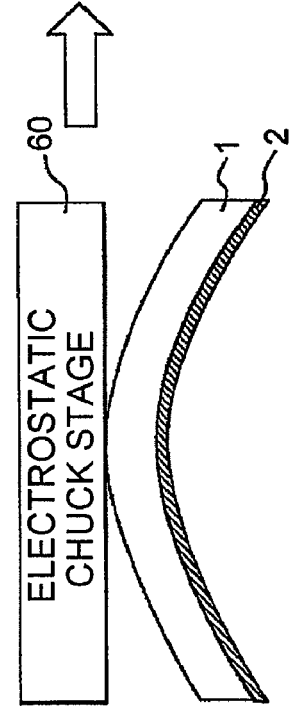
FIG. 5C
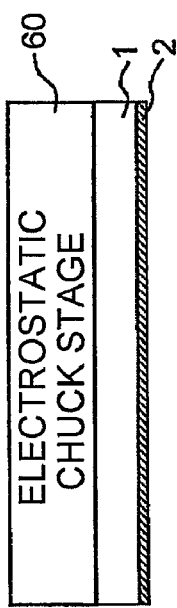 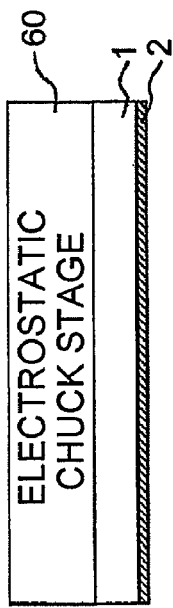 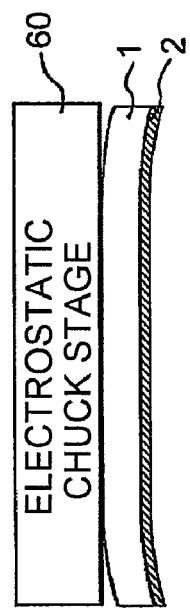

REFLECTIVE MASK BLANK FOR EXPOSURE, REFLECTIVE MASK FOR EXPOSURE, METHOD OF PRODUCING A SEMICONDUCTOR DEVICE, AND SUBSTRATE PROVIDED WITH MULTILAYER REFLECTIVE FILM

This application claims priority to Japanese Patent Application No. 2006-283754, the disclosure of which is incorporated herein by reference.

BACKGROUND OF THE INVENTION

This invention relates to a reflective mask blank for exposure, a reflective mask for exposure, and a multilayer reflective film-coated substrate for use in the semiconductor production or the like and to a method of producing a semiconductor device.

In the semiconductor industry, use has conventionally been made of the photolithography method using visible light or ultraviolet light as a transfer technique of a fine pattern required for forming a fine-pattern integrated circuit on a Si substrate or the like. However, wavelength shortening in the conventional light exposure has been approaching the exposure limit while the miniaturization of semiconductor devices has been accelerated. The pattern resolution limit is said to be ⅓ of an exposure wavelength in the case of the light exposure and, for example, it is about 60 nm using an ArF excimer laser (wavelength 193 nm). In recent liquid immersion exposure, an improvement in resolution has been achieved and it is expected that about 45 nm can be resolved, but a further increase in light-exposure resolution is difficult. In view of this, as an exposure technique with a higher resolution than 45 nm, the EUV lithography (hereinafter referred to as "EUVL") being an exposure technique using EUV light with a wavelength shorter than that of the ArF excimer laser is expected to be promising. Herein, the EUV (Extreme Ultra Violet) light represents light in a wavelength band of the soft X-ray region or the vacuum ultraviolet region and, specifically, light having a wavelength of about 0.2 to 100 nm.

The image forming principle of EUVL is the same as that of the photolithography. However, since the absorption of any substance for EUV light is large and the refractive index is close to 1, use cannot be made of a refractive optical system used in the light exposure, but is made of a reflective optical system in any case. As a mask for use in that event, there has conventionally been proposed a transmissive mask using a membrane. However, there is a problem that since the absorption of the membrane for EUV light is large, the exposure time becomes long and thus high throughput cannot be achieved. Therefore, a reflective mask is generally used in the current state.

For example, Japanese Examined Patent Application Publication (JP-B) No. H7-27198 (Patent Document 1) or Japanese Unexamined Patent Application Publication (JP-A) No. H8-213303 (Patent Document 2) discloses a reflective mask for exposure in which a reflective layer having a multilayer film structure is formed on a substrate and an absorber adapted to absorb a soft X-ray or a vacuum ultraviolet ray is formed in a pattern on the reflective layer. FIGS. 1A and 1B are exemplary sectional views showing an example of such a conventional reflective mask blank for exposure and a conventional reflective mask for exposure. The reflective mask blank for exposure shown in FIG. 1A is configured such that a multilayer reflective film 101 having a multilayer film structure is formed on a substrate 100, an etching stopper layer 102 is formed on the multilayer reflective film 101, and an absorbent layer 103 is formed on the etching stopper layer 102. A pattern 103a is formed in the absorbent layer 103 of the reflective mask blank for exposure and the unnecessary etching stopper layer 102 on the multilayer reflective film 101 is removed along the absorbent layer pattern 103a, thereby fabricating the reflective mask for exposure shown in FIG. 1B. Exposure light such as a soft X-ray incident on the reflective mask for exposure is reflected at a portion where the multilayer reflective film 101 is exposed, while, is not reflected but is absorbed at a portion where the pattern 103a of the absorbent layer is formed. As a result, it is possible to form a pattern (optical image) with a high contrast between a reflected portion and an absorbed portion.

However, in the reflective mask for exposure having the multilayer reflective film 101 and so on formed on the substrate 100 as described above, it is necessary to increase the film density of each layer of the multilayer reflective film 101 in order to obtain a high reflectance. Consequently, the multilayer reflective film 101 inevitably has a high compressive stress. Because of this high compressive stress, the substrate 100 is largely warped (deformed) to thereby form a convex surface as shown in FIG. 2. As a result, the surface of the multilayer reflective film 101 serving as a reflecting surface for EUV light is also subjected to warping. For example, when a compressive stress of about 400 MPa is applied to a multilayer reflective film with a thickness of about 0.3 μm on a 6-inch square (152.4 mm×152.4 mm) quartz glass substrate with a thickness of 6.35 mm, warping (deformation) of about 1000 nm occurs in an area of 142 mm×142 mm.

The absorbent layer 103 and the etching stopper layer 102 formed on the multilayer reflective film 101 are each required to have a low stress close to zero because of being subjected to patterning and, therefore, the flatness of the mask blank is mainly controlled by the film stress of the multilayer reflective film. Generally, the reflective mask for EUV light is fixed by an electrostatic chuck during exposure. It has conventionally been considered that even if the mask is deformed as shown in FIG. 2, the flatness of the mask can be corrected by the electrostatic chuck. However, in the prior art, the mask surface is deformed into a convex surface by about 1 μm in the compression direction due to high compressive stress of the multilayer reflective film and thus the back surface of the mask (i.e. the surface on the side adsorbed by the electrostatic chuck) becomes a concave surface. In the case of the electrostatic chuck, the principle is such that adsorption spreads from a contact point and, therefore, the mask substrate is brought into contact therewith from its outer side and the adsorption spreads toward its inner side. FIGS. 3A and 3B each show the state where the mask blank (or the mask) is fixed (adsorbed) by the electrostatic chuck. Since the flatness of the mask blank is mainly controlled by the film stress of the multilayer reflective film, the film-coated substrate in which the multilayer reflective film 101 is formed on the substrate 100 is shown as an example herein for convenience of description. In each of FIGS. 3A and 3B, a diagram on the left side shows the state where the film-coated substrate is first brought into contact with an electrostatic chuck stage 60 and a diagram on the right side shows the state where the film-coated substrate is finally adsorbed. As shown in FIG. 3A, when the surface to be adsorbed by the electrostatic chuck is a concave surface like the conventional structure, there has been a problem that since outer-side contact points first brought into contact with the electrostatic chuck are fixed, a clearance at a center portion formed at the time of the first contact is not completely removed and thus adsorption failure occurs or, even if adsorbed, the substrate is not completely corrected (flattened).

For this problem, it is considered to reduce the stress of the multilayer reflective film 101. However, this reduces the film density and causes a reduction in reflectance of EUV light, and thus is not preferable from a practical viewpoint. In addition, a method is considered that improves the flatness using a stress correction film. However, even if the stress correction film is formed, it is technically difficult to completely correct the in-plane stress distribution and the film thickness distribution and, even if the flatness exhibits a certain flatness, the in-plane distortion is not completely removed and thus the problem of adsorption failure is not solved. Further, depending on a material used for the stress correction film, there is a case where the substrate is not flattened and waviness occurs. Even if attempting to fix the film-coated substrate having such waviness by the electrostatic chuck, the distortion is not removed, thus resulting in adsorption failure (see FIG. 3B). Further, it is not possible to avoid occurrence of a further change in film stress due to heat loads generated in the mask blank fabrication processes and the mask fabrication processes and due to a time-dependent change. In view of the foregoing, there has been a limit in adjusting to improve the flatness by the use of the stress correction film.

SUMMARY OF THE INVENTION

This invention has been made in view of the foregoing circumstances and has an object to provide a reflective mask blank for exposure, a reflective mask for exposure, and a multilayer reflective film-coated substrate that can solve the problem of adsorption failure in fixing the reflective mask by an electrostatic chuck.

For accomplishing the foregoing object, this invention has the following structures.

(Structure 1) A reflective mask blank for exposure having a multilayer reflective film formed on a board and adapted to reflect exposure light and an absorbent layer formed on the multilayer reflective film and adapted to absorb the exposure light, the reflective mask blank for exposure characterized in that a shape of a surface of the mask blank on its side opposite to its transfer pattern forming surface is a shape having a convex surface.

According to Structure 1, since the shape of the surface of the mask blank on its side opposite to its transfer pattern forming surface (the surface on the side opposite, across the substrate, to the side where the multilayer reflective film and the absorbent layer are formed), i.e. the surface to be adsorbed by an electrostatic chuck, is the shape having the convex surface, when a reflective mask fabricated from such a mask blank is fixed by the electrostatic chuck, the mask is first brought into contact with an electrostatic chuck stage from an inner-side apex portion of the convex surface and then adsorption spreads toward its outer side and, therefore, the mask is adsorbed on the electrostatic chuck stage with no clearance therebetween. As a result, the mask surface can be flattened by the electrostatic chuck and thus it is possible to realize high-accuracy pattern transfer with no pattern distortion.

In this invention, the foregoing shape having the convex surface is a shape when the surface shape of the surface of the mask blank on its side opposite to its transfer pattern forming surface is measured using interference of light.

(Structure 2) A reflective mask blank for exposure according to Structure 1, characterized in that the surface of the mask blank on its side opposite to its transfer pattern forming surface has a flatness of 50 nm or more and 1000 nm or less.

According to Structure 2, since the flatness of the surface of the mask blank on its side opposite to its transfer pattern forming surface (the surface on the side opposite, across the substrate, to the side where the multilayer reflective film and the absorbent layer are formed) is set to 50 nm or more and 1000 nm or less, the mask in its wider area is adsorbed on the electrostatic chuck stage with no clearance therebetween and therefore it is possible to reduce a flatness effective area required for the mask.

The flatness described in this invention is a value indicative of warping (deformation amount) of a surface given by TIR (Total Indicated Reading) and is defined as follows. That is, in FIG. 4, a plane determined by the method of least squares on the basis of a substrate surface 41 is given as a focal plane 42, then, using this focal plane 42 as a reference, an absolute value of a height difference between the highest position A of the substrate surface 41 located above the focal plane 42 and the lowest position B of the substrate surface 41 located below the focal plane 42 is defined as a flatness. Therefore, the flatness always takes a positive value. In this invention, the flatness is given by a measured value in an area of 142×142 (mm). For example, it is a measured value in an area of 142×142 (mm) at the center of a 6-inch substrate.

(Structure 3) A reflective mask blank for exposure according to Structure 1, characterized by having a stress correction film for correcting warping of the mask blank so that the shape of the surface of the mask blank on its side opposite to its transfer pattern forming surface becomes the shape having the convex surface.

According to Structure 3, by providing the stress correction film for correcting warping of the mask blank, the shape of the surface of the mask blank on its side opposite to its transfer pattern forming surface (the surface on the side opposite, across the substrate, to the side where the multilayer reflective film and the absorbent layer are formed) can be the shape having the convex surface.

(Structure 4) A reflective mask blank for exposure according to Structure 3, characterized in that the stress correction film having a compressive stress is provided on the surface of the mask blank on its side opposite to its transfer pattern forming surface.

According to Structure 4, by providing the stress correction film having the compressive stress on the surface of the mask blank on its side opposite to its transfer pattern forming surface (the surface on the side opposite, across the substrate, to the side where the multilayer reflective film and the absorbent layer are formed), adjustment can be easily carried out so that the shape of the surface of the mask blank on its side opposite to its transfer pattern forming surface becomes the shape having the convex surface.

(Structure 5) A reflective mask blank for exposure according to Structure 3, characterized in that the stress correction film is made of a material containing tantalum (Ta).

According to Structure 5, since the stress correction film is made of the material containing tantalum (Ta), it is possible to form the stress correction film excellent in smoothness.

(Structure 6) A reflective mask blank for exposure according to Structure 5, characterized in that the stress correction film is made of the material containing tantalum (Ta) as a main component and at least boron (B).

According to Structure 6, since the stress correction film is made of the material containing particularly tantalum (Ta) as the main component and at least boron (B), it is possible to form the stress correction film having the compressive stress and, further, being excellent in smoothness.

(Structure 7) A reflective mask for exposure characterized in that a transfer pattern is formed in the absorbent layer of the reflective mask blank for exposure according to any of Structures 1 to 6.

According to Structure 7, using the reflective mask for exposure formed with the transfer pattern in the absorbent layer of the reflective mask blank for exposure according to any of Structures 1 to 6, it is possible to flatten the surface of the mask using the electrostatic chuck and thus to realize high-accuracy pattern transfer with no pattern distortion.

(Structure 8) A semiconductor device manufacturing method characterized by transferring the transfer pattern of the reflective mask for exposure according to Structure 7 onto a semiconductor substrate by a photolithography method.

By transferring the transfer pattern of the reflective mask for exposure according to Structure 7 onto the semiconductor substrate by the photolithography method, there is obtained a semiconductor device formed with a high-accuracy pattern with no pattern distortion.

(Structure 9) A multilayer reflective film-coated substrate having on a substrate a multilayer reflective film adapted to reflect exposure light, the multilayer reflective film-coated substrate characterized in that a shape of a surface of the multilayer reflective film-coated substrate on its side opposite to the multilayer reflective film is a shape having a convex surface.

According to Structure 9, since the shape of the surface of the multilayer reflective film-coated substrate on its side opposite to the multilayer reflective film is the shape having the convex surface, when a reflective mask fabricated from a mask blank using such a multilayer reflective film-coated substrate is fixed by the electrostatic chuck, the mask is first brought into contact with the electrostatic chuck stage from an inner-side apex portion of the convex surface and then adsorption spreads toward its outer side and, therefore, the mask is adsorbed on the electrostatic chuck stage with no clearance therebetween. Consequently, the mask surface can be flattened by the electrostatic chuck and thus it is possible to realize high-accuracy pattern transfer with no pattern distortion.

(Structure 10) A multilayer reflective film-coated substrate according to Structure 9, characterized in that the surface of the multilayer reflective film-coated substrate on its side opposite to the multilayer reflective film has a flatness of 50 nm or more and 1000 nm or less.

According to Structure 10, since the flatness of the surface of the multilayer reflective film-coated substrate on its side opposite to the multilayer reflective film is set to 50 nm or more and 1000 nm or less, the reflective mask fabricated from the mask blank using such a multilayer reflective film-coated substrate is adsorbed in its wider area on the electrostatic chuck stage with no clearance therebetween and therefore it is possible to reduce a flatness effective area required for the mask.

(Structure 11) A multilayer reflective film-coated substrate according to Structure 9 or 10, characterized by having a stress correction film for correcting warping of the multilayer reflective film-coated substrate so that the shape of the surface of the multilayer reflective film-coated substrate on its side opposite to the multilayer reflective film becomes the shape having the convex surface.

According to Structure 11, by providing the stress correction film for correcting warping of the multilayer reflective film-coated substrate, the shape of the surface of the multilayer reflective film-coated substrate on its side opposite to the multilayer reflective film can be the shape having the convex surface.

According to this invention, it is possible to provide a reflective mask blank for exposure, a reflective mask for exposure, and a multilayer reflective film-coated substrate that can solve the conventional problem of adsorption failure in fixing the reflective mask using an electrostatic chuck and thus can flatten the surface of the mask using the electrostatic chuck, thereby realizing high-accuracy pattern transfer.

BRIEF DESCRIPTION OF THE DRAWINGS

FIGS. 3A and 3B are sectional views each exemplarily showing the state where the conventional reflective mask blank or the like is adsorbed by an electrostatic chuck.

FIGS. 5A to 5C are sectional views each exemplarily showing the state where a reflective mask blank or the like of this invention is adsorbed by an electrostatic chuck.

DESCRIPTION OF THE PREFERRED EMBODIMENTS

Figure 1A:
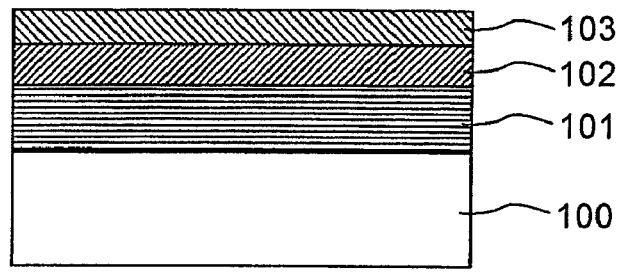
FIGS. 1A and 1B are sectional views of a conventional reflective mask blank and a conventional reflective mask.
Figure 1B:
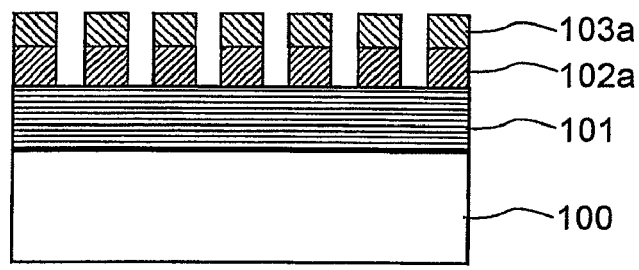
Figure 2:
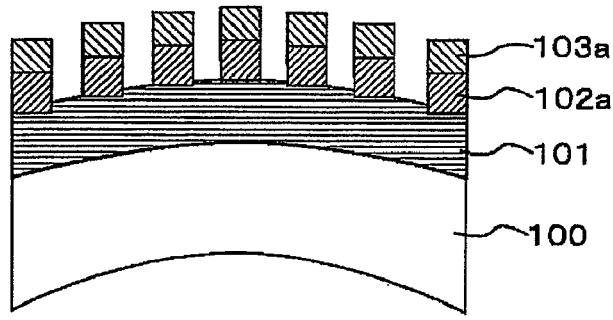
FIG. 2 is a sectional view of the conventional reflective mask.
Figure 4:
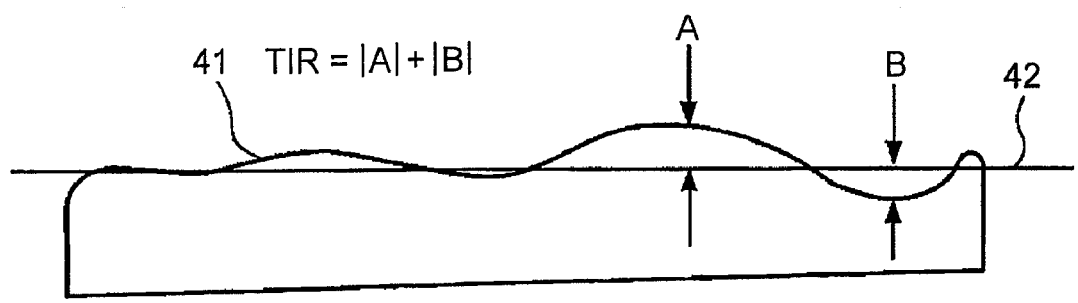
FIG. 4 is a conceptual diagram for explaining the definition of the flatness TIR.

Hereinbelow, the best mode for carrying out this invention will be described in detail.

A multilayer reflective film-coated substrate according to this invention is a multilayer reflective film-coated substrate having on a substrate a multilayer reflective film adapted to reflect exposure light and is characterized in that the shape of a surface of the multilayer reflective film-coated substrate on its side opposite to the multilayer reflective film is a shape having a convex surface.

According to such a multilayer reflective film-coated substrate, since the shape of the surface of the multilayer reflective film-coated substrate on its side opposite to the multilayer reflective film is the shape having the convex surface, when a reflective mask fabricated from a mask blank using such a multilayer reflective film-coated substrate is fixed by an electrostatic chuck, the mask is first brought into contact with an electrostatic chuck stage from an inner-side apex portion of the convex surface and then adsorption spreads toward its outer side and, therefore, the mask is adsorbed on the electrostatic chuck stage with no clearance therebetween. Therefore, the mask surfaces (particularly the reflecting surface provided by the multilayer reflective film) can be flattened by the electrostatic chuck and thus it is possible to realize high-accuracy pattern transfer with no pattern distortion.

FIGS. 5A to 5C each show the state where a mask blank (or a mask) is fixed (adsorbed) by an electrostatic chuck. Since the flatness of the mask blank is mainly controlled by the film stress of a multilayer reflective film, a multilayer reflective film-coated substrate in which a multilayer reflective film 2 is formed on a substrate 1 is shown as an example herein for convenience of description. In each of FIGS. 5A to 5C, a diagram on the left side shows the state where the multilayer reflective film-coated substrate is first brought into contact with an electrostatic chuck stage 60 and a diagram on the right side shows the state where the multilayer reflective film-coated substrate is finally adsorbed. As shown in FIG. 5A, when the surface to be adsorbed by the electrostatic chuck is a convex surface according to this invention, the multilayer reflective film-coated substrate is first brought into contact with the electrostatic chuck stage 60 from an inner-side apex portion of the convex surface and then adsorption spreads toward its outer side and, therefore, the multilayer reflective film-coated substrate is finally adsorbed on the electrostatic chuck stage 60 with no clearance therebetween. FIG. 5B shows the case where the degree of bending of the multilayer reflective film-coated substrate is somewhat greater than that in FIG. 5A. Even such a substrate is finally adsorbed on the electrostatic chuck stage 60 with no clearance therebetween.

A reflective mask blank according to this invention is a reflective mask blank for exposure having an absorbent layer, adapted to absorb the exposure light, on the multilayer reflective film of the multilayer reflective film-coated substrate and is characterized in that the shape of a surface of the mask blank on its side opposite to its transfer pattern forming surface is a shape having a convex surface.

In this manner, since the shape of the surface of the mask blank on its side opposite to its transfer pattern forming surface, i.e. the surface to be adsorbed by the electrostatic chuck, is the shape having the convex surface, when a reflective mask fabricated from such a mask blank is fixed by the electrostatic chuck, the mask is first brought into contact with the electrostatic chuck stage from an inner-side apex portion of the convex surface and then adsorption spreads toward its outer side and, therefore, the mask is adsorbed on the electrostatic chuck stage with no clearance therebetween. As a result, the mask surface can be flattened by the electrostatic chuck and thus it is possible to realize high-accuracy pattern transfer with no pattern distortion. The foregoing FIGS. 5A to 5C each show the case of the multilayer reflective film-coated substrate, but this is entirely the same also in the case of the reflective mask blank of this invention.

As also described before, in this invention, the shape having the convex surface is a shape when the surface shape of the surface of the mask blank on its side opposite to its transfer pattern forming surface is measured using interference of light. Specifically, use can be made of surface shape information measured by a flatness degree measuring apparatus using interference of light.

In this invention, the flatness of the surface of the mask blank on its side opposite to its transfer pattern forming surface is preferably 50 nm or more and 1000 nm or less. By setting the flatness of the surface of the mask blank on its side opposite to its transfer pattern forming surface to 50 nm or more and 1000 nm or less, the mask in its wider area is adsorbed on the electrostatic chuck stage with no clearance therebetween and therefore it is possible to reduce a flatness effective area required for the mask. If the flatness is greater than 1000 nm, there is a case, as shown in FIG. 5C, where since the degree of bending is large, adsorption failure occurs at the outer periphery. However, even in this case, since the flatness is ensured in a more central region where a mask pattern is formed, excellent pattern-transfer accuracy is achieved.

In this invention, it is sufficient that the shape of a surface, to be adsorbed by an electrostatic chuck, of a multilayer reflective film-coated substrate or a reflective mask blank be a shape having a convex surface. Therefore, this invention is not limited to the case where the entire surface in section has the simple convex shape as shown in each of the foregoing FIGS. 5A to 5C. For example, even in the case where a stress correction film is formed on a substrate having a certain degree of waviness to thereby reduce the waviness to provide a shape that is regarded as a convex shape on the whole, the function and effect of this invention can be suitably obtained, which is thus also included in this invention.

The shape having the convex surface or the convex shape in this invention represents, for example, a surface shape in which when the surface shape of a surface in a predetermined region including the center of the main surface of a substrate is measured by the flatness degree measuring apparatus using interference of light, the height distribution of the measurement surface measured by using as a reference plane a focal plane calculated by the method of least squares on the basis of the measurement surface exhibits a tendency of reduction from the center or approximate center of the substrate toward the peripheral edge (outer periphery).

Fabrication of a multilayer reflective film-coated substrate and a reflective mask blank and fabrication of a reflective mask using them according to this invention comprise respective processes, i.e. (1) process of preparing a substrate, (2) process of forming a multilayer reflective film on the substrate, (3) process of forming an intermediate layer (etching stopper layer), (4) process of forming an exposure light absorbent layer, (5) process of forming a stress correction film, (6) process of coating a resist for EB (Electron Beam), (7) EB writing process, and (8) etching process. Hereinbelow, a description will be given with reference to FIGS. 6A to 6D.

Figure 6A:
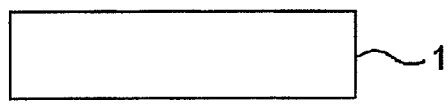
FIGS. 6A to 6D are sectional views showing one example of fabrication processes of a reflective mask of this invention.

(1) Process of preparing a Substrate (see FIG. 6A). As a substrate 1, it is preferable to use a substrate having a low thermal expansion coefficient and being excellent in smoothness and flatness and in resistance to a cleaning solution for use in mask cleaning or the like and thus use is made of a glass having a low thermal expansion coefficient such as, for example, an $SiO_2$—$TiO_2$-based glass, but not limited thereto, i.e. it is also possible to use a substrate of a crystallized glass precipitated with β-quartz solid solution, a quartz glass, silicon, a metal, or the like. As an example of the metal substrate, an Invar alloy (Fe—Ni-based alloy) or the like can be used. The substrate 1 preferably has a smooth surface of 0.2 nmRms or less with a flatness of 100 nm or less for achieving a high reflectance and transfer accuracy.

In this invention, the unit Rms showing the smoothness represents the root mean square roughness and can be measured by an atomic force microscope (AFM). Specific measurement is carried out, for example, in a range of 10 μm square, but it is preferable to uniformly have this smoothness over an effective area of a mask. Herein, the effective area of the mask may be considered to be a range of, for example, about 142 mm square in the case of a mask for EUV light exposure.

Figure 6B:
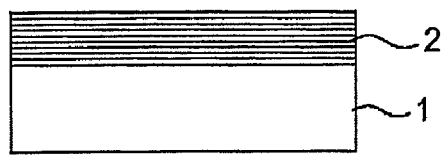

(2) Process of forming a Multilayer Reflective Film on the Substrate (see FIG. 6B). Alternately laminated films made of Mo and Si are often used as a multilayer reflective film 2, but use may be made, as a material that can obtain a high reflectance in a specific wavelength range, of Ru/Si, Mo/Be, Mo compound/Si compound, a Si/Nb cycle multilayer film, a Si/Mo/Ru cycle multilayer film, a Si/Mo/Ru/Mo cycle multilayer film, a Si/Ru/Mo/Ru cycle multilayer film, or the like. However, the optimum film thickness differs depending on the material. In the case of the multilayer film made of Mo and Si, using the DC (Direct Current) magnetron sputtering method, a Si target is first used to form a Si film in an Ar gas atmosphere, then a Mo target is used to form a Mo film in the Ar gas atmosphere and, given that this forms one cycle, Si and Mo films are laminated by 30 to 60 cycles, preferably by 40 cycles, and finally, a Si film is formed. Herein, as an example of a stress possessed by the multilayer reflective film 2, it is −500 MPa with a thickness of 0.2 μm. By this process, a multilayer reflective film-coated substrate is obtained.

Figure 6C:
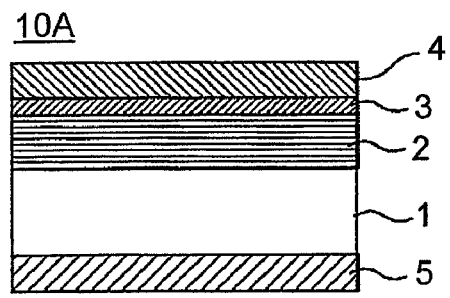
Figure 6D:
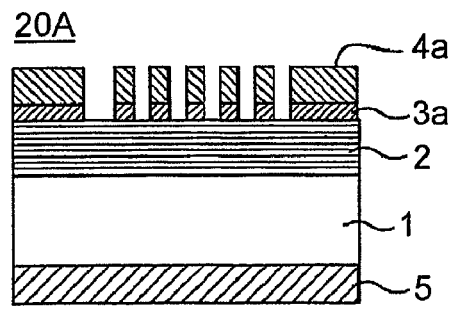
Figure 7A:
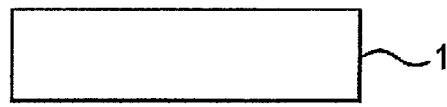
FIGS. 7A to 7D are sectional views showing another example of fabrication processes of a reflective mask of this invention.
Figure 7B:
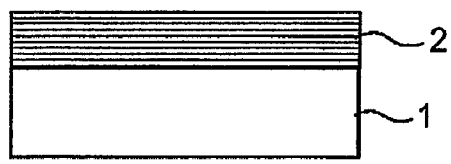
Figure 7C:
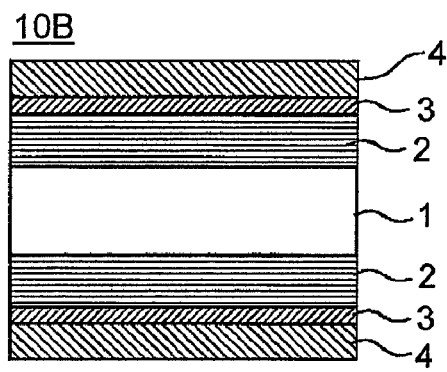
Figure 7D:
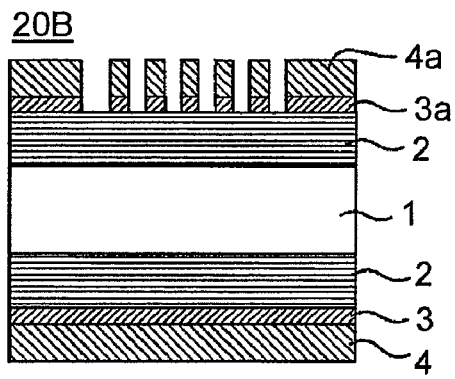
Figure 8A:
FIGS. 8A to 8D are sectional views showing still another example of fabrication processes of a reflective mask of this invention.
Figure 8B:
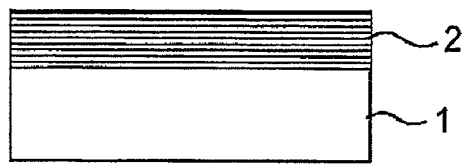
Figure 8C:
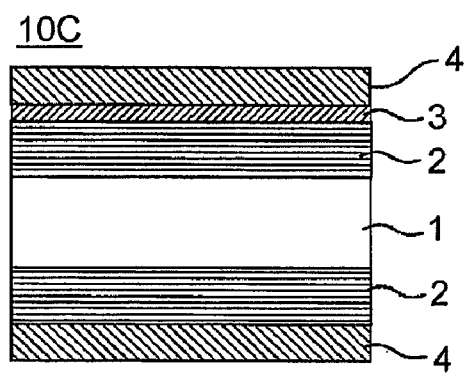
Figure 8D:
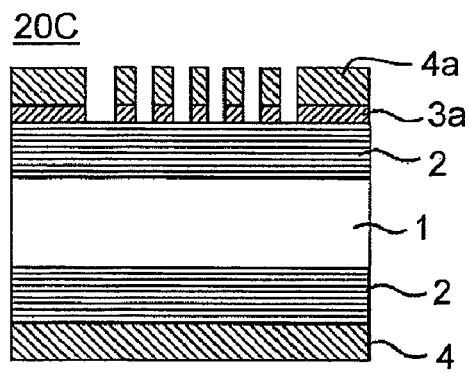

(3) Process of forming an Intermediate Layer (Etching Stopper Layer) (see FIG. 6C). CrN is often used as a material of an intermediate layer (etching stopper layer) 3, but depending on the conditions for etching an absorbent layer 4, $SiO_2$ or the like may be used as a material having high etching resistance. In the case of using CrN, it is preferable that a Cr target be used in a mixed gas atmosphere of Ar and nitrogen to form a CrN film on the multilayer reflective film 2 using the DC magnetron sputtering method.

(4) Process of forming an Exposure Light Absorbent Layer (see FIG. 6C). As a material of the absorbent layer 4 for exposure light such as EUV light, there is cited a material containing Ta as a main component, a material containing Ta as a main component and at least B, an amorphous material containing Ta as a main component, an amorphous material containing Ta as a main component and at least B (e.g. an amorphous material containing about 25% B, given by $Ta_4B$), a material containing Ta, B, and N (e.g. an amorphous material containing Ta as a main component, 15% B, and about 10% N), or the like. Further, generally, in order to reduce a reflectance at a wavelength of inspection light (normally DUV light) for use in a mask inspection, an oxide layer is formed as an upper layer of the absorbent layer to thereby enhance a contrast in the mask inspection. For example, there is preferably cited a material containing Cr as a main component and at least one component selected from N, O, and C (e.g. CrN or a material in which O or C is added to CrN), or the like. However, not limited thereto, but use can be made of TaSi, TaSiN, TaGe, TaGeN, WN, Cr, TiN, or the like.

In an example of using a TaB compound thin film as a material of the absorbent layer 4, it is preferable that, using the DC magnetron sputtering method, a TaB target be used to first form a TaB film in an Ar gas atmosphere and then a TaBO film in an Ar and oxygen gas atmosphere. In this event, it is preferable that the stress of the absorbent layer 4 be set to 50 MPa or less by optimizing the sputtering conditions (gas pressure, DC power, etc.).

(5) Process of forming a Stress Correction Film (see FIG. 6C). In order to accomplish the foregoing object of this invention, a stress correction film 5 for correcting warping (deformation) of the substrate 1 caused by the stress possessed by the multilayer reflective film 2 and so on is formed under the conditions as will be described later, thereby correcting the warping (deformation) of the substrate 1 and further controlling the stress so as to slightly deform the substrate 1 in a tensile direction even if the multilayer reflective film 2 having the high stress is formed, so that the shape of a back surface of a mask blank, i.e. a surface to be adsorbed by an electrostatic chuck in the case of a reflective mask, can be maintained to be a shape having a convex surface.

With this configuration, by increasing the flatness of the multilayer reflective film surface when the reflective mask is fixed by the electrostatic chuck at the time of exposure for pattern transfer, it is possible to suppress a position offset in the pattern transfer to thereby increase the accuracy. Specifically, in the case where the back surface of the mask blank is formed as a convex surface having a flatness of 50 nm or more and 1000 nm or less, the position offset in the transfer can be suppressed to about 1.1 nm which is caused by the flatness of the glass substrate, thus enabling high-accuracy pattern transfer.

The stress of the multilayer reflective film 2 can be derived by measuring warping of the substrate before and after the formation of the multilayer reflective film and calculating a difference of the warping before and after the film formation. Herein, the compressive stress has a minus sign and the tensile stress has a plus sign. Since the stress of the multilayer reflective film can be estimated to some degree from its material and film forming conditions, it is also possible to estimate the stress of the multilayer reflective film from experimentally obtained data and so on and to determine the stress/thickness to be given to the stress correction film. Further, the stress/thickness to be given to the stress correction film may be suitably corrected by carrying out monitoring according to necessity.

If a substrate having no warping (deformation) can be used as the substrate 1, the stress correction film 5 may be formed to have a stress and thickness that cancel the stress possessed by the multilayer reflective film 2 and, further, slightly deform it in a tensile direction. Herein, since the stress is generally given by a value per unit thickness, the material, the film forming conditions, and the thickness of the stress correction film 5 may be determined so as to balance the stress per unit thickness×thickness between the films to be formed.

Herein, a method of forming the stress correction film 5 will be described. Since the stress correction film is required to be easily given a strong compressive stress and to be a smooth film, an amorphous material is preferable. Further, a material containing Ta as a main component is preferable. An amorphous material containing Ta as a main component is preferable. The smoothness of the stress correction film surface is preferably 0.2 nmRms or less, and more preferably 0.15 nmRms or less. As an example of forming the stress correction film, in the case of using a TaB film (a film containing Ta and B), it is preferable to form the film in an Ar gas atmosphere at room temperature using the DC magnetron sputtering method. The stress possessed by the stress correction film can be adjusted to a desired value by properly controlling the film forming method and the film forming conditions (sputtering gas pressure, input power, thickness, etc.).

For example, in the case of a TaB film, when the sputtering gas pressure is changed under the constant input power, the stress changes according to the sputtering gas pressure such that a compressive stress is exhibited on a low pressure side, then the stress decreases as the gas pressure is raised, and finally exhibits zero, then a tensile stress is exhibited when the gas pressure is further raised, and the stress increases along with the gas pressure. Using this effect, it is possible to cancel the stress possessed by the multilayer reflective film 2 and further to deform it in an opposite direction using the stress possessed by the stress correction film 5. The stress value and direction possessed by the stress correction film 5 can be adjusted by controlling the sputtering conditions (sputtering gas pressure, input power, thickness, etc.). Herein, in a film containing Ta and B, B is preferably 10 to 30 at %. In a film containing Ta, B, and N, when N is 5 to 30 at % and components other than N are 100 at %, B is preferably 10 to 30 at %.

As a material of the stress correction film 5, a material containing Si as a main component can be used as an example other than the foregoing TaB. Specifically, the material is Si alone or Si doped with an additive, wherein N or O is cited as the additive. The material containing Si as the main component is preferably in an amorphous state and is preferably given semiconductor-like properties. This is because when the stress correction film is formed on the back surface of the substrate (the surface on the side where the multilayer reflective film is not formed), if the stress correction film 5 made of the conductive material is provided on the back surface of the substrate 1, the chucking performance is improved when chucking the back surface of the substrate 1 by the electrostatic chuck.

Further, as a material of the stress correction film 5, a material containing Cr can be used. As the material containing Cr, use can be made of, for example, a material containing Cr and N. In this material containing Cr and N, the ratio of N is preferably 5 to 35 at %, and more preferably 10 to 25 at %. Further, it is preferable that the material containing Cr and N contain O and/or C. These materials containing Cr are excellent in smoothness and cleaning resistance and also excellent in stress controllability. Further, these materials containing Cr each can be formed into a film by the DC sputtering method or the like. As the examples of the stress correction film 5, the TaB films, the Si-based films, and the Cr-based films have been cited above, but not limited thereto, i.e. any film may be used as long as it is a film whose stress can be easily controlled and thus use can be made of Ta, TaN, TaGe, TaGeN, TaSi, TaSiN, WN, or the like.

As causes of warping of the mask blank, warping possessed by the substrate itself and warping caused by the stress possessed by the multilayer reflective film formed on the substrate are main causes. In the case of the structure including, in addition thereto, intermediate layers such as, for example, a protective layer and an etching stopper layer, the stress/thickness of the stress correction film may be determined also in consideration of stresses of those intermediate layers so as to finally obtain a desired flatness.

Through the foregoing processes, a reflective mask blank 10A is obtained.

(6) EB Resist Coating Process. A reflective mask can be fabricated by forming a pattern in the absorbent layer 4 of the obtained reflective mask blank 10A. An EB resist is coated on the mask blank obtained in Process (5) and baking is carried out.

(7) EB Writing Process. The mask blank coated with the EB resist is subjected to pattern writing by the use of an EB writer and then development, thereby forming a resist pattern.

(8) Etching Process. Using this resist pattern as a mask, the absorbent layer 4 is, for example, dry-etched to thereby form an absorbent layer pattern 4a. Then, the resist remaining on the absorbent layer pattern is removed using, for example, heated concentrated sulfuric acid. Further, the underlying intermediate layer 3 is removed by, for example, dry etching along the absorbent layer pattern 4a. By this process, a reflective mask 20A is obtained (see FIG. 6D).

Herein, the method of the pattern formation in the absorbent layer has been described by the example of using the etching method, but is not limited thereto, and use can be made of, for example, the lift-off method or the like.

In the foregoing processes of FIGS. 6A to 6D, the description has been given of the case where the stress correction film 5 in the form of the single layer is formed on the back surface of the mask blank (the surface, where the multilayer reflective film 2 is not formed, of the substrate 1). However, as such a stress correction film, a multilayer reflective film the same as that on the front surface or a suitable combination of a multilayer reflective film and an intermediate layer/an absorbent layer the same as those on the front surface may be formed. For example, FIGS. 7A to 7D illustrate a mask blank 10B in which a multilayer reflective film, an intermediate layer, and an absorbent layer the same as those on the front surface are formed on the back surface of the mask blank and FIGS. 8A to 8D illustrate a mask blank 10C in which a multilayer reflective film and an absorbent layer the same as those on the front surface are formed on the back surface of the mask blank.

In this embodiment, the description has been given of the example where the formation of the stress correction film 5 on the back surface of the substrate 1 is performed after the processes of forming the multilayer reflective film 2, the intermediate layer 3, and the absorbent layer 4, but not limited thereto, i.e. for example, it may be performed before or after forming the multilayer reflective film 2, after forming the intermediate layer 3, or after forming the absorbent layer 4.

EXAMPLES

Hereinbelow, the embodiment of this invention will be described in further detail in terms of Examples. Simultaneously, a Comparative Example in contrast to the Examples of this invention will also be described.

Example 1

As a substrate 1, use was made of a low expansion $SiO_2$—$TiO_2$-based glass substrate having a 6-inch square size with a thickness of 6.35 mm. The substrate 1 had a smooth surface of 0.2 nmRms or less with a flatness of 40 nm by mechanical polishing.

Then, Mo and Si were laminated as a multilayer reflective film 2 on the substrate 1. Using the DC magnetron sputtering method, a Si target was first used to form a Si film to 4.2 nm in an Ar gas at 0.1 Pa, then a Mo target was used to form a Mo film to 2.8 nm in the Ar gas at 0.1 Pa and, given that this forms one cycle, Si and Mo films were laminated by 40 cycles, and finally, a Si film was formed to 11 nm. Herein, the stress possessed by the multilayer reflective film 2 was −500 MPa. The multilayer reflective film-coated substrate obtained herein had a convex shape with a flatness of 1200 nm.

Then, using a Cr target and using as a sputtering gas a mixed gas containing an Ar gas and 20% nitrogen added thereto, an intermediate layer (etching stopper layer) 3 in the form of a CrN film was formed to a thickness of 10 nm on the multilayer reflective film 2 by the DC magnetron sputtering method. Herein, the stress of the intermediate layer 3 was 50 MPa or less.

Finally, on the intermediate layer 3 in the form of the CrN film, as an EUV-light absorbent layer 4, a film containing Ta and B (where Ta:B=75:15 (at %)) was formed to a thickness of 66 nm by the DC magnetron sputtering method and, subsequently, using a TaB target and a mixed gas of Ar and oxygen, a TaBO film was formed by the DC magnetron sputtering method. By controlling the sputtering conditions, the stress possessed by the EUV-light absorbent layer 4 was set to 50 MPa or less. As a result, there was obtained a mask blank in which the multilayer reflective film surface had a convex shape with a flatness of 1200 nm.

Then, a TaB film (where Ta:B=75:15 (at %)) as a stress correction film 5 was formed on the back surface of the substrate 1. The TaB film was formed to a thickness of 0.3 μm in an Ar gas at 0.01 Pa at room temperature using the DC magnetron sputtering method. As a result, the stress possessed by the stress correction film 5 was controlled to a stress that cancels the stress possessed by the multilayer reflective film 2 and, further, slightly deforms it in a tensile direction. Consequently, there was obtained a reflective mask blank in which the flatness of the mask blank was 200 nm and the shape of the back surface of the mask blank was a convex shape.

Then, using this reflective mask blank, a reflective mask having a design rule of 32 nm half-pitch (DRAM: Dynamic Random Access Memory) (minimum line width 128 nm) was fabricated by the following method.

At first, an EB resist was coated on the reflective mask blank and dried, and then a resist pattern was formed by EB writing.

Using this resist pattern as a mask, the adsorbent layer 4 in the form of the laminated layers of TaBO and TaB was dry-etched using chlorine to thereby form an absorbent layer pattern. Then, the resist pattern remaining on the absorbent layer pattern was removed and, using the absorbent layer pattern as a mask, the underlying intermediate layer 3 in the form of the CrN film was removed by the use of a mixed gas of chlorine and oxygen, thereby fabricating a reflective mask.

With respect to this fabricated reflective mask, the flatness of the back surface of the mask was measured by a flatness degree measuring apparatus using interference of light. As a result, it was confirmed to have a convex surface with a flatness of 200 nm.

Figure 9:
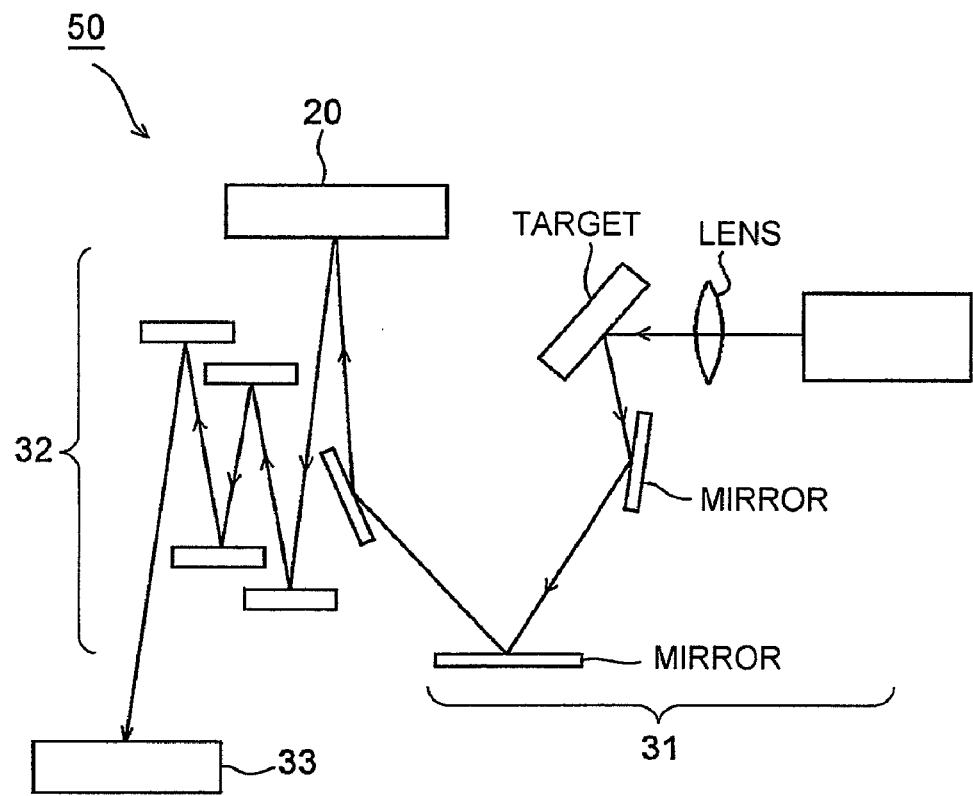
FIG. 9 is a system diagram of a pattern transfer apparatus.

Using the fabricated reflective mask, pattern transfer onto a semiconductor substrate was carried out by a pattern transfer apparatus shown in FIG. 9. As shown in FIG. 9, EUV light (soft X-ray) obtained from a laser plasma X-ray source 31 is incident on a reflective mask 20 and the light reflected therefrom is transferred onto, for example, a Si wafer substrate 33 through a reduction optical system 32.

X-ray reflecting mirrors can be used as the reduction optical system 32. A pattern reflected from the reflective mask 20 is normally reduced in size to about a quarter through the reduction optical system 32. For example, transfer of the pattern onto the Si wafer substrate 33 can be performed by exposing the pattern onto a resist film formed on the Si substrate 3 and developing it. In the case of using a wavelength band of 13 to 14 nm as an exposure wavelength, transfer is normally carried out so that an optical path is located in a vacuum.

As a result of performing the pattern transfer onto the semiconductor substrate using the reflective mask obtained in this Example as described above, it has been confirmed that sufficiently highly accurate adsorption onto the stage by the electrostatic chuck can be realized in the exposure and the pattern having high position accuracy can be formed by the exposure.

Example 2

As a substrate 1, use was made of a glass substrate having a flatness equal to that in Example 1.

On the surface of this glass substrate, there was formed a multilayer reflective film 2 the same as that in Example 1 and, on this multilayer reflective film, there was formed an intermediate layer (etching stopper layer) 3 in the form of a CrN film the same as that in Example 1. Further, on this intermediate layer, there was formed an absorbent layer 4 containing Ta and B and adapted to absorb EUV light, the same as that in Example 1.

Then, on the back surface of the glass substrate (on the side where the multilayer reflective film was not formed), as a stress correction film, there were formed, in the same manner as on the front surface, a multilayer film in the form of 45-cycle alternately laminated films of Mo and Si (thickness: 0.294 μm) with a Si layer of 11 nm as the uppermost layer, a CrN film of 10 nm, and a TaB film. The TaB film (where Ta:B=75:15 (at %)) was formed to a thickness of 70 nm in an Ar gas at 0.2 Pa at room temperature using the DC magnetron sputtering method. Herein, the stress condition of the multilayer film was set equal to the stress possessed by the multilayer reflective film 2 formed on the front surface side and, by increasing the thickness, the total force (stress×thickness) on the back surface was set slightly greater. As a result, there was obtained a reflective mask blank in which the flatness of the mask blank was 100 nm and the shape of the back surface of the mask blank was a convex shape.

Using this reflective mask blank, a reflective mask was fabricated in the same manner as in Example 1. With respect to the fabricated reflective mask, the flatness of the back surface of the mask was measured by the flatness degree measuring apparatus using interference of light. As a result, it was confirmed to have a convex surface with a flatness of 100 nm.

As a result of performing pattern transfer onto a semiconductor substrate using the fabricated reflective mask by the pattern transfer apparatus shown in FIG. 9, it has been confirmed that sufficiently highly accurate adsorption onto the stage by the electrostatic chuck can be realized in the exposure and a pattern having high position accuracy can be formed by the exposure.

Example 3

A reflective mask blank and a reflective mask were fabricated in the same manner as in Example 2 except that only a multilayer film in the form of 45-cycle alternately laminated films of Mo and Si (thickness: 0.294 μm) was formed as a stress correction film.

As a result, the reflective mask blank was such that the flatness of the mask blank was 200 nm and the shape of the back surface of the mask blank was a convex shape. With respect to the reflective mask, the back surface of the mask was confirmed to have a convex surface with a flatness of 200 nm.

As a result of performing pattern transfer onto a semiconductor substrate using the fabricated reflective mask by the pattern transfer apparatus shown in FIG. 9, it has been confirmed that sufficiently highly accurate adsorption onto the stage by the electrostatic chuck can be realized in the exposure and a pattern having high position accuracy can be formed by the exposure.

COMPARATIVE EXAMPLE

A reflective mask blank and a reflective mask were fabricated in the same manner as in Example 1 except that the formation of the stress correction film 5 on the back surface of the substrate 1 in Example 1 was not carried out. With respect to the fabricated reflective mask, the flatness of the surface of the multilayer reflective film was measured by the flatness degree measuring apparatus using interference of light. As a result, it was confirmed to have a convex surface with a flatness of 1200 nm.

As a result of performing pattern transfer onto a semiconductor substrate using the fabricated reflective mask by the pattern transfer apparatus shown in FIG. 9, there occurred failure in adsorption onto the stage by the electrostatic chuck in the exposure and, therefore, a position offset was large in the pattern transfer so that it was not possible to perform high-accuracy pattern transfer.

What is claimed is:

1. A reflective mask blank for exposure comprising:
a substrate;
a multilayer reflective film formed on the surface of the substrate and adapted to reflect exposure light; and
an absorbent layer formed on said multilayer reflective film and adapted to absorb the exposure light,
wherein said multilayer reflective film has a compressive stress, and
wherein said reflective mask blank for exposure further comprises a stress correction film having a compressive stress and formed on an opposite substrate-surface of said substrate so that a shape of a surface of said mask blank on its side opposite to its transfer pattern forming surface becomes a shape having a convex surface.

2. A reflective mask blank for exposure according to claim 1, characterized in that the surface of said mask blank on its side opposite to its transfer pattern forming surface has a flatness of 50 nm or more and 1000 nm or less.

3. A reflective mask blank for exposure according to claim 1, wherein said stress correction film is adapted to correct warping of said mask blank so that the shape of the surface of said mask blank on its side opposite to its transfer pattern forming surface becomes the shape having the convex surface.

4. A reflective mask blank for exposure according to claim 1, characterized in that said stress correction film is made of a material containing tantalum (Ta).

5. A reflective mask blank for exposure according to claim 4, characterized in that said stress correction film is made of the material containing tantalum (Ta) as a main component and at least boron (B).

6. A reflective mask for exposure characterized in that a transfer pattern is formed in said absorbent layer of the reflective mask blank for exposure according to any of claims 1, 2, 3, 4, and 5.

7. A semiconductor device manufacturing method characterized by transferring said transfer pattern of the reflective mask for exposure according to claim 6 onto a semiconductor substrate by a photolithography method.

8. A reflective mask blank for exposure according to claim 1, wherein said multilayer reflective film is a cycle multilayer film made of a material that can obtain a high reflectance for EUV (Extreme Ultra Violet) light.

9. A reflective mask blank for exposure according to claim 1, wherein said substrate is made of a material selected from the group of a glass having a low thermal expansion coefficient, a crystallized glass, and a quartz glass.

10. A multilayer reflective film-coated substrate comprising;
a substrate;
a multilayer reflective film being formed on a surface of said substrate, said multilayer reflective film being adapted to reflect exposure light and having a compressive stress, and
a stress correcting film formed on said multilayer reflective film-coated substrate, said stress correction film having a compressive stress and formed on an opposite substrate-surface of said substrate so that a shape of a surface of said multilayer reflective film-coated substrate on its side opposite to said multilayer reflective film becomes a shape having a convex surface.

11. A multilayer reflective film-coated substrate according to claim 10, characterized in that the surface of said multilayer reflective film-coated substrate on its side opposite to said multilayer reflective film has a flatness of 50 nm or more and 1000 nm or less.

12. A multilayer reflective film-coated substrate according to claim 10 or 11, wherein said stress correction film is adapted to correct warping of said multilayer reflective film-coated substrate so that the shape of the surface of said multilayer reflective film-coated substrate on its side opposite to said multilayer reflective film becomes the shape having the convex surface.

13. A multilayer reflective film-coated substrate according to claim 10, wherein said multilayer reflective film is a cycle multilayer film made of a material that can obtain a high reflectance for EUV (Extreme Ultra Violet) light.

14. A multilayer reflective film-coated substrate according to claim 10, wherein said substrate is made of a material selected from the group of a glass having a low thermal expansion coefficient, a crystallized glass, and a quartz glass.

* * * * *

UNITED STATES PATENT AND TRADEMARK OFFICE
CERTIFICATE OF CORRECTION

| | | |
|---|---|---|
| PATENT NO. | : 7,910,264 B2 | Page 1 of 1 |
| APPLICATION NO. | : 11/874446 | |
| DATED | : March 22, 2011 | |
| INVENTOR(S) | : Tsutomu Shoki | |

It is certified that error appears in the above-identified patent and that said Letters Patent is hereby corrected as shown below:

On the title page,

Item (22): delete "April 15, 2008" and insert -- October 18, 2007 --

Column 16, Line 1: In Claim 10, delete "comprising;" and insert -- comprising: --

Signed and Sealed this
Second Day of August, 2011

David J. Kappos
*Director of the United States Patent and Trademark Office*